United States Patent [19]

Baze

[11] Patent Number: 5,414,709
[45] Date of Patent: May 9, 1995

[54] CIRCUIT FOR GENERATING A CONFIGURATION SIGNAL FOR A NETWORK SYSTEM

[75] Inventor: Mel Baze, Haifa, Israel
[73] Assignee: Intel Corporation, Santa Clara, Calif.
[21] Appl. No.: 223,458
[22] Filed: Apr. 5, 1994
[51] Int. Cl.⁶ ........................................ H04L 12/437
[52] U.S. Cl. .................................. 370/85.5; 370/16.1; 370/85.1; 370/85.12; 370/85.15; 307/98; 307/99
[58] Field of Search ................ 370/85.5, 85.12, 85.15, 370/85.1, 85.13, 56, 5; 375/121, 36, 76; 340/825.5, 825.05; 307/98, 99, 100, 103, 109

[56] References Cited

U.S. PATENT DOCUMENTS 4,937,476  6/1990  Bazes .................................. 307/475

Primary Examiner—Douglas W. Olms
Assistant Examiner—Ricky Q. Ngo
Attorney, Agent, or Firm—Blakely, Sokoloff, Taylor & Zafman

[57] ABSTRACT

A station of a ring network includes (1) a circuit for generating a configuration signal for connecting the station into the network and (2) a load circuit coupled to the first node and ground for receiving a DC component of the configuration signal. The DC component of the configuration signal is transparent with respect to data transmission of the network. A decoupling capacitor is coupled to the first node and ground for bypassing an AC component of the configuration signal at the first node to ground such that only the DC component of the configuration signal is applied to the load circuit. The circuit for generating the configuration signal includes (1) a first switch coupled to a power supply and a second node and (2) a capacitor coupled to the second node and ground. A second switch is provided in the circuit that is connected between the first and second nodes. The first and second switches alternately connect the capacitor to the power supply and to the first node such that the configuration signal is generated at the first node. The capacitor has a capacitance that can be substantially accurately set such that an impedance of the circuit is substantially accurately set. A logic circuit is provided in the circuit for generating a first control signal to the first switch and a second control signal to the second switch to alternately close the first and second switches.

13 Claims, 3 Drawing Sheets

CIRCUIT FOR GENERATING A CONFIGURATION SIGNAL FOR A NETWORK SYSTEM

FIELD OF THE INVENTION

The present invention pertains to the field of integrated circuits. More particularly, this invention relates to an improved circuit for generating a configuration signal for configuring a station into a network, wherein the configuration signal is transparent with respect to data transmission of the network and wherein the impedance of the circuit is substantially accurately set.

BACKGROUND OF THE INVENTION

Token Ring local area network systems are well known in the prior art. A prior art Token Ring network typically includes a number of data stations or terminals connected sequentially together in a ring configuration via transmission cables. A coupling unit is typically provided in a Token Ring network for serially connecting a station into the network. When a new station needs to be connected into the ring network, the new station, when connected to its corresponding coupling unit, generates a DO configuration signal to the coupling unit. The coupling unit then uses the DC signal to effect a switching action to break the ring connection and serially connect the new station into the network at the breaking point. Cessation of the DC configuration signal typically causes a switching action in the coupling unit that bypasses the station and causes the station to be put in a looped (i.e., wrapped) state. This loop may be used by the station for the off-line self-testing functions.

The DC configuration signal does not affect the data transmission within the network because it is in DC form. Therefore, the DC configuration signal is transparent to the data transmission of the network. The DC configuration signal is also referred to as a phantom signal.

The phantom signal is typically generated by a phantom driver in the station. The phantom signal is applied to a phantom load which transfers the signal to the coupling unit. The phantom driver, however, needs to satisfy a number of requirements in order (1) to guarantee ring insertion of the station under non-fault conditions and (2) to detect and notify fault conditions. These requirements typically require the phantom driver to output a voltage not less than 4.1 volts for a DC current of zero to 1.0 milliampere. The phantom driver is also required to output a voltage not less than 3.9 volts for a DC current of 1.0 milliampere to 2.0 milliamperes. The phantom driver is also required to supply as a current source a DC current of no more than 20 milliamperes when the output of the phantom driver is short circuited. A phantom load having an impedance between 2.9K$\Omega$ ("kilo-ohms") and 5.5K$\Omega$ shall be detected as a non-fault condition. A phantom load having an impedance equal to or less than 0.1K$\Omega$ shall be detected as a short-circuit fault condition. A phantom load having an impedance equal to or greater than 9.9K$\Omega$ shall be detected as an open-circuit fault condition. A phantom load having an impedance between 0.1K$\Omega$ and 2.9K$\Omega$ or 5.5K$\Omega$ and 9.9K$\Omega$ shall be detected either as a fault condition or non-fault condition, depending on the implementation of the phantom driver.

An analysis of the above mentioned requirements indicates that the basic implementation of the phantom driver requires a resistor (i.e., resistor 21) connected to a voltage supply $V_{CC}$, as illustrated in FIG. 1. As shown in FIG. 1, the output of phantom driver 20 is then connected to a phantom load 10 and a decoupling capacitor 11. Decoupling capacitor 11 is typically required by the Token Ring standard to be connected to the output of the phantom driver and ground. The resistance value of resistor 21 is required to be within the range of 200 $\Omega$ to 300 $\Omega$.

One implementation of resistor 21 is through n-well diffusion that diffuses the resistor into the well of a substrate. An n-well diffusion resistor typically has a resistance accuracy of approximately up to $\pm 20\%$. Resistors fabricated by other implementations, such as polysilicon deposition, tend to have less resistance accuracy than that of the diffusion resistor.

Disadvantages are, however, associated with such phantom driver circuit. One disadvantage is that the resistance of resistor 21 is required to be relatively accurately set in order to guarantee adequate margin for high yield to the phantom load specifications. The lower the accuracy of the resistor, the lower the design margin for the phantom load. The resistance accuracy required for resistor 21 is typically better than $\pm 15\%$. This indicates that resistor 21 of phantom driver 20 typically cannot be fabricated by the n-well diffusion or other known resistor fabrication processes that typically have less accuracy than the diffusion resistor.

SUMMARY AND OBJECTS OF THE INVENTION

One of the objects of the present invention is to provide a circuit for generating a configuration signal to configure a station into a network, wherein the circuit includes an impedance that is substantially accurately set.

Another object of the present invention is to provide a circuit for generating a configuration signal to configure a station into a network, wherein the circuit is fabricated in a cost effective manner.

Another object of the present invention is to provide a circuit for generating a configuration signal to configure a station into a network, wherein the impedance of the circuit is substantially accurately set while the circuit is fabricated in a cost effective manner.

A further object of the present invention is to provide a circuit for generating a configuration signal to configure a station into a network, wherein the circuit includes a capacitor that has a substantially accurately set capacitance so as to substantially accurately determine the impedance of the circuit.

A station of a ring network includes (1) a circuit for generating a configuration signal for connecting the station into the network and (2) a load circuit coupled to the output of the circuit and ground for receiving a DC component of the configuration signal. The DC component of the configuration signal is transparent with respect to data transmission of the network. A decoupling capacitor is coupled to the output of the circuit and ground for bypassing an AC component of the configuration signal at the output of the circuit to ground such that only the DC component of the configuration signal is applied to the load circuit. The circuit for generating the configuration signal includes (1) a first switch coupled to a power supply and a node and (2) a capacitor coupled to the node and ground. A second switch is provided in the circuit that is connected between the node and the output of the circuit. The first and second switches alternately connect the capacitor to the power supply and to the output of the circuit such that the configuration signal is generated at the output of the circuit. The capacitor has a capacitance that can be substantially accurately set such that the impedance of the circuit is substantially accurately set. A logic circuit is provided in the circuit for generating a first control signal to the first switch and a second control signal to the second switch to alternately close the first and second switches. The logic circuit is controlled by a pulse signal to generate the first and second control signals.

A circuit for generating a configuration signal to configure a station into a network is described. The configuration signal is transparent with respect to data transmission of the network. The circuit includes (1) a first switch coupled to a power supply and a node and (2) a capacitor coupled to the node and ground. A second switch is coupled to the node and an output of the circuit. The output of the circuit is coupled to a resistive load. The first and second switches alternately connect the capacitor to the power supply and the output of the circuit such that the configuration signal is generated to the load. The capacitor has a capacitance that can be substantially accurately set such that an impedance of the circuit is substantially accurately set. A logic circuit is coupled to the first and second switches for generating a first control signal to the first switch and a second control signal to the second switch to alternately close the first and second switches. The logic circuit is controlled by a pulse signal to generate the first and second control signals.

Other objects, features, and advantages of the present invention will be apparent from the accompanying drawings and from the detailed description that follows below.

BRIEF DESCRIPTION OF THE DRAWINGS

The present invention is illustrated by way of example and not limitation to the figures of the accompanying drawings, in which like references indicate similar elements and in which.

DETAILED DESCRIPTION

Figure 1:
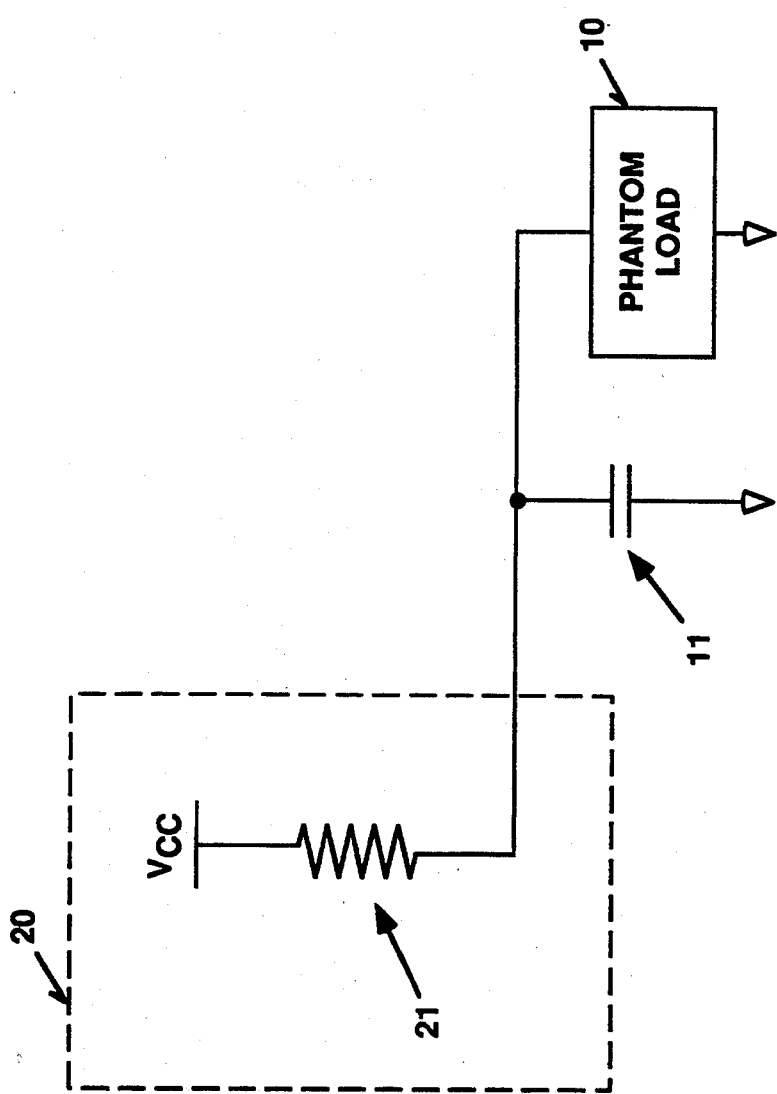
FIG. 1 is a block diagram of a prior art driver circuit for generating a configuration signal to configure a station into a network.
Figure 2:
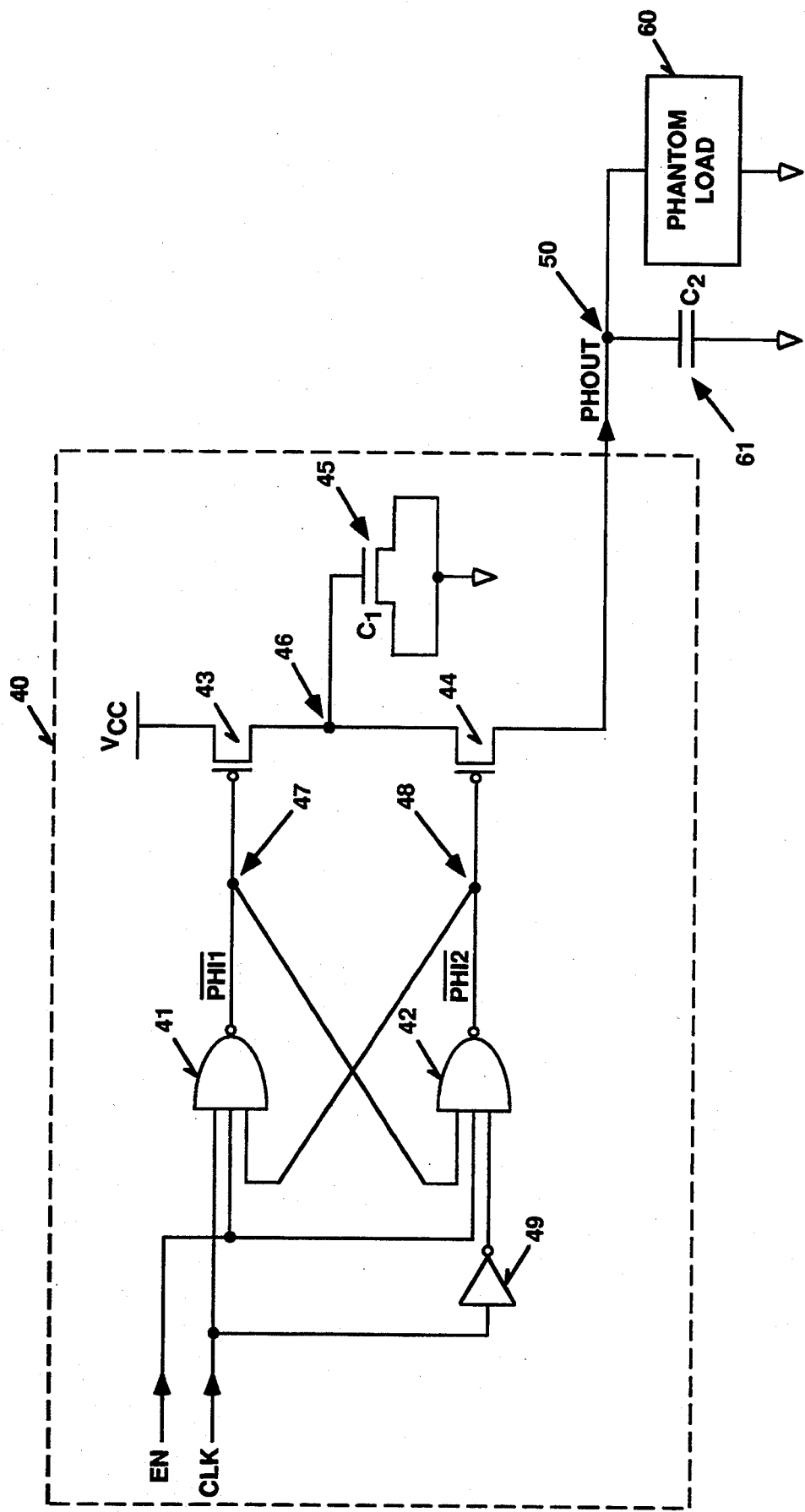
FIG. 2 is a circuit diagram of a driver circuit for generating a configuration signal to configure a station into a network in accordance with one embodiment of the present invention, wherein the impedance of the driver circuit is accurately set.

FIG. 2 illustrates the circuit of a driver circuit 40 in accordance with one embodiment of the present invention. Driver circuit 40 generates a configuration signal PHOUT to a load 60 of a data station (not shown in FIG. 2). The PHOUT signal is used for configuring the station into a network system (also not shown in FIG. 2). The configuration signal PHOUT is in DC form that is transparent with respect to the data transmission of the network system. Therefore, the PHOUT signal can be referred to as phantom signal and driver circuit 40 and load 60 can be referred to as phantom driver circuit and phantom load, respectively.

For one embodiment, the network system is a Token Ring network. For alternative embodiments, the network system can be other types of network systems.

Figure 3:
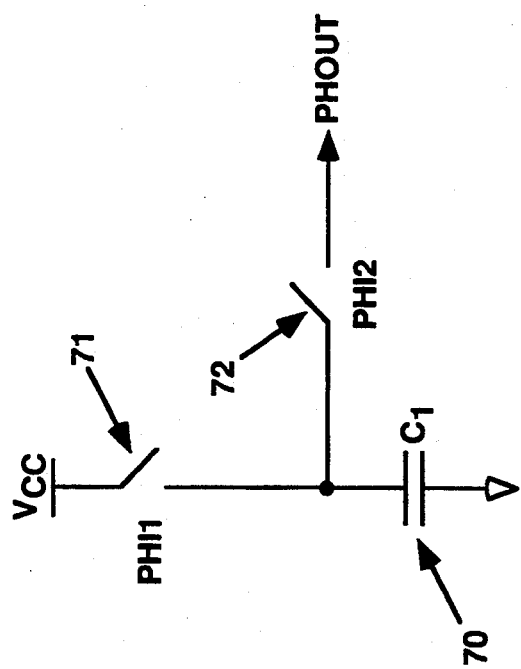
FIG. 3 shows the equivalent circuit of the driver circuit of FIG. 2.

Driver circuit 40 is substantially a switched capacitor circuit. FIG. 3 shows the circuit equivalence of driver circuit 40 of FIG. 2, which will be described in more detail below. Driver circuit 40 substantially accurately sets its output impedance in a cost effective manner. Driver circuit 40 accomplish this by substantially accurately setting the capacitance of its capacitor. Alternatively, driver circuit 40 can be other type of circuit.

For one embodiment, driver circuit 40 is implemented on a single semiconductor substrate using digital metal oxide semiconductor ("MOS") technology. For alternative embodiments, driver circuit 40 can be implemented using other process technologies.

Driver circuit 40 includes two transistors 43 and 44 connected serially between a power supply $V_{CC}$ and an output node 50. The gate of transistor 43 is connected to a node 47 for receiving a $\overline{PHI1}$ signal and the gate of transistor 44 is connected to a node 48 for receiving a $\overline{PHI2}$ signal. Transistor 43 is connected to transistor 44 at a node 46.

In the preferred embodiment, transistors 43 and 44 are both P-channel transistors. Accuracy depends on capability to pull node 46 all the way up to $V_{CC}$. A P-channel transistor can do this.

Node 46 is also connected to the gate of a transistor 45. Transistor 45 has its drain and source connected together to ground. Transistor 45 functions as a capacitor in circuit 40, with the gate capacitance (i.e., gate-to-source) of transistor 45 being the capacitance of the capacitor.

The connection of transistor 45 helps to ensure that other parasitic capacitances of transistor 45 do not contribute to the gate capacitance of transistor 45. This thus allows the gate capacitance of transistor 45 to be substantially accurately determined.

As is known, a transistor typically includes a source-to-substrate capacitance and a drain-to-substrate capacitance, in addition to the gate-to-substrate capacitance. In order to allow the gate capacitance of transistor 45 to be independent of the source-to-substrate and drain-to-substrate capacitances of the transistor, these capacitances should be bypassed. By connecting the source and drain of transistor 45 to ground as shown in FIG. 2, these capacitances are effectively canceled and the capacitor formed by the gate capacitance of transistor 45 is independent of any parasitic capacitance within transistor 45 and can be substantially accurately set. For one embodiment, transistor 45 is an N-channel transistor.

For one embodiment, transistors 43–45 are fabricated using a digital MOS fabrication process. For alternative embodiments, other fabrication processes can be used to manufacture transistors 43–45. For example, analog processes can be used to fabricate transistors 43–45.

Transistor 45 can be replaced with other circuit elements or connected in other ways to form the capacitor. For one embodiment, transistor 45 is substituted by a capacitor.

Transistors 43–44 are controlled by the $\overline{PHI1}$ and $\overline{PHI2}$ signals, respectively, to switch on and off. In functional terms, transistors 43 and 44 act as switches in the circuit. Therefore, transistors 43–44 can be substituted with other types of circuit elements. For example, switches can be used.

Functionally, transistors 43 through 45 can be shown as two switches connected to a capacitor, as shown in FIG. 3. FIG. 3 shows the equivalent circuit of driver circuit 40 of FIG. 2. In other words, FIG. 3 shows circuit 40 of FIG. 2 in a substantially functional manner.

As can be seen in FIG. 3, a switch 71 connects a capacitor 70 to the power supply $V_{CC}$. A switch 72 connects capacitor 70 to the output PHOUT of the circuit. Switch 71 is controlled by the PHI1 signal and switch 72 is controlled by the PHI2 signal. Switch 71 corresponds to transistor 43 of FIG. 2 and switch 72 corresponds to transistor 44 of FIG. 2. Capacitor 70 corresponds to the capacitor formed by transistor 45 of FIG. 2.

Referring back to FIG. 2, the $\overline{\text{PHI1}}$ signal is generated by NAND gate 41. The $\overline{\text{PHI2}}$ signal is generated by another NAND gate 42. Each of NAND gates 41–42 receives an enable signal EN. NAND gate 41 receives a clock signal CLK. NAND gate 42 receives the CLK signal via an inverter 49. The CLK signal has a frequency of f. NAND gates 41 and 42 are also cross coupled. NAND gates 41 and 42 and inverter 49 together form a phase splitter circuit. This allows the $\overline{\text{PHI1}}$ and $\overline{\text{PHI2}}$ signals to be alternatively asserted, thus alternately turning on transistors 43 and 44.

For one embodiment, the frequency f of the CLK signal is approximately 32 MHz. For alternative embodiments, the frequency f of the CLK signal can be greater or less than 32 MHz.

Alternatively, the phase splitter circuit formed by NAND gates 41 and 42 and inverter 49 can be replaced with other circuits. The function of the $\overline{\text{PHI1}}$ and $\overline{\text{PHI2}}$ signals is to control transistors 43 and 44 to be alternately turned on such that a direct path from the power supply $V_{CC}$ to output node 50 is never created.

Driver circuit 40 generates the PHOUT signal at output node 50. The PHOUT signal is then applied to phantom load 60. Phantom load 60 represents the circuits that receive the PHOUT signal to configure the station into the network. As can be seen from FIG. 2, a decoupling capacitor 61 is also connected to node 50. Decoupling capacitor 61 is used to filter out signals that are in AC form. As a result, phantom load 60 is ensured to receive only the DC form signal from driver circuit 40.

For one embodiment, the capacitance of decoupling capacitor 61 is approximately 10 μF. For alternative embodiments, the capacitance of decoupling capacitor 61 can be greater or less than 10 μF. In addition, decoupling capacitor 61 may include a number of capacitors.

Decoupling capacitor 61 is required at the output of driver circuit 40. Decoupling capacitor 61 is used to ensure that phantom load 60 receives the PHOUT signal from driver circuit 40 in pure DC form. This helps to ensure that the PHOUT signal received at phantom load 60 does not affect the data transmission of the network and is transparent to the data transmission of the network.

As can be seen from FIGS. 2–3, during operation, driver circuit 40 is enabled by the EN signal. When the EN signal is logically inactive, the $\overline{\text{PHI1}}$ and $\overline{\text{PHI2}}$ signals are not asserted and transistor 43 and 44 are both turned off. When the EN signal is asserted, the $\overline{\text{PHI1}}$ and $\overline{\text{PHI2}}$ signals are alternately asserted in accordance with the CLK signal. When $\overline{\text{PHI1}}$ signal is asserted and the $\overline{\text{PHI2}}$ signal is deasserted, transistor 43 is turned on and transistor 44 is turned off. This connects the power supply $V_{CC}$ to the capacitor formed by transistor 45 which charges the capacitor up to the $V_{CC}$ voltage. Next, when the CLK signal causes the $\overline{\text{PHI1}}$ signal to be deasserted and the $\overline{\text{PHI2}}$ signal to be asserted, transistor 43 is switched off and transistor 44 is switched on. This causes the capacitor formed by transistor 45 to be connected to node 50. Because node 50 is also connected to decoupling capacitor 61 and phantom load 60, the capacitor formed by transistor 45 is partially discharged. A full discharge will occur only if node 50 is short circuited to ground.

The partial discharge of the capacitor formed by transistor 45 generates a current that flows through decoupling capacitor 61 and phantom load 60. Decoupling capacitor 61 is thus charged. This generates a $V_{PHOUT}$ voltage at node 50. Decoupling capacitor 61 is used to maintain the $V_{PHOUT}$ voltage constant at node 50 at all time.

Initially, decoupling capacitor 61 is not charged. When transistor 44 first connects the capacitor formed by transistor 45 to node 50, decoupling capacitor 61 is charged up to the $V_{PHOUT}$ voltage. Since then, decoupling capacitor 61 is charged when the capacitor formed by transistor 45 is connected to node 50, and is discharged when the capacitor formed by transistor 45 is not connected to node 50. Because decoupling capacitor 61 has a relatively large capacitance, the charge and discharge of capacitor 61 remains at minimum level. This allows the $V_{PHOUT}$ voltage at node 50 to remain constant.

Assuming that the capacitor formed by transistor 45 has a capacitance $C_1$, decoupling capacitor 61 has a capacitance $C_2$, and the effective resistance of phantom load 60 is R, in the steady state, capacitor $C_1$ charges up to $V_{CC}$ and discharges to $V_O$ once per clock period. Therefore, in each clock period, capacitor $C_1$ transfers a packet of charge from $V_{CC}$ to phantom load 60 that is equal to $C_1(V_{CC} - V_O)$. The current $I_{OUT}$ flowing out of $V_{CC}$ is, then, given by $$I_{OUT} = \frac{C_1(V_{CC} - V_0)}{T_P} = f \cdot C_1(V_{CC} - V_0), \quad \text{(Eq. 1)}$$

wherein $T_p$ is the clock period and f is the frequency of the CLK signal.

The current $I_{OUT}$ is equal to the current into phantom load 60 in the steady state. Therefore, $$I_{OUT} = \frac{V_0}{R}, \quad \text{(Eq. 2)}$$

wherein R is the resistance of phantom load 60. Substituting equation 2 into equation 1 and rearranging we obtain $$V_0 = \frac{V_{CC}}{1 + \frac{1}{f \cdot C_1 \cdot R}}. \quad \text{(Eq. 3)}$$

Equation 3 has the form of a voltage divider in which the lower resistor has a value of R and the upper resistor has a value of $1/f \cdot C_1$. Therefore, equation 3 can be rewritten as $$V_0 = \frac{V_{CC}}{1 + \frac{R_{EFF}}{R}}, \quad \text{(Eq. 4)}$$

wherein $R_{EFF}$ is the effective resistance of driver circuit 40 in the voltage divider formed by the combination of driver circuit 40 and phantom load 60 and is given by $$R_{EFF} = \frac{1}{f \cdot C_1}. \quad \text{(Eq. 5)}$$

As described above, because the capacitance $C_1$ of the capacitor formed by transistor 45 can be substantially accurately set and independent of any parasitic capacitance in the circuit, the effective resistance $R_{EFF}$ of driver circuit 40 can also be substantially accurately determined.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A circuit for generating a configuration signal to configure a station into a network, wherein the configuration signal is transparent with respect to data transmission of the network, wherein the circuit has an impedance, wherein the circuit comprises:
   (A) a first switch coupled to a power supply and a node;
   (B) a capacitor coupled to the node and ground;
   (C) a second switch coupled to the node and an output of the circuit, wherein the output of the circuit is coupled to a resistive load, wherein the first and second switches cause the capacitor to be alternately connected to one of the power supply and the output of the circuit in order to generate the configuration signal to the resistive load, wherein the capacitor has a capacitance that can be substantially accurately set which in turn accurately sets the impedance of the circuit;
   (D) a logic circuit coupled to the first and second switches for generating a first control signal to the first switch and a second control signal to the second switch to alternately close the first and second switches, wherein the logic circuit is controlled by a pulse signal to generate the first and second control signals.

2. The circuit of claim 1, wherein the resistive load further comprises a decoupling capacitor coupled between the output of the circuit and ground for bypassing an AC component of the configuration signal to the ground which allows the configuration signal to be transparent with respect to the data transmission of the network.

3. The circuit of claim 1, wherein the capacitor is formed by a metal-oxide-semiconductor field effect transistor (MOSFET) with (1) a gate of the MOSFET as a first end of the capacitor and (2) a source, a drain, and a substrate of the MOSFET together as a second end of the capacitor such that the capacitor is independent of parasitic capacitance.

4. The circuit of claim 3, wherein the MOSFET is fabricated by a low cost standard digital metal-oxide-semiconductor process not requiring any analog processing.

5. The circuit of claim 1, wherein the impedance of the circuit is a function of (1) the capacitance of the capacitor and (2) a frequency of the pulse signal.

6. The circuit of claim 5, wherein the logic circuit is a phase splitter circuit that includes two cross-coupled NAND gates and an inverter coupled to one of the NAND gates, wherein the logic circuit is enabled to generate the first and second control signals by an enable signal which is applied to each of the NAND gates.

7. The circuit of claim 1, wherein each of the first and second switches is a MOSFET transistor.

8. A station of a ring network, comprising:
   (a) a load circuit coupled to a first node and ground for receiving a DC component of a configuration signal for connecting the station into the network, wherein the DC component of the configuration signal is transparent with respect to data transmission of the network;
   (b) a decoupling capacitor coupled to the first node and the ground for bypassing an AC component of the configuration signal at the first node to the ground such that only the DC component of the configuration signal is applied to the load circuit;
   (c) a circuit coupled to the first node for generating the configuration signal, wherein the circuit further includes an impedance, wherein the circuit further comprises
      (i) a first switch coupled to a power supply and a second node;
      (ii) a capacitor coupled to the second node and ground;
      (iii) a second switch coupled to the first and second nodes, wherein the first and second switches cause the capacitor to be alternately connected to one of the power supply and the first node in order to generate the configuration signal at the first node, wherein the capacitor has a capacitance that can be accurately set which in turn accurately sets the impedance of the circuit;
      (iv) a logic circuit coupled to the first and second switches for generating a first control signal to the first switch and a second control signal to the second switch to alternately close the first and second switches, wherein the logic circuit is controlled by a pulse signal to generate the first and second control signals.

9. The station of claim 8, wherein the capacitor is formed by a metal-oxide-semiconductor field effect transistor (MOSFET) with (1) a gate of the MOSFET as a first end of the capacitor and (2) a source, a drain, and a substrate of the MOSFET together as a second end of the capacitor which allows the capacitor to be independent of parasitic capacitance.

10. The station of claim 9, wherein the MOSFET is fabricated by a low cost standard digital metal-oxide-semiconductor process not requiring any analog processing.

11. The station of claim 8, wherein the impedance of the circuit is a function of (1) the capacitance of the capacitor and (2) a frequency of the pulse signal.

12. The circuit of claim 8, wherein the logic circuit is a phase splitter circuit that includes two cross-coupled NAND gates and an inverter coupled to one of the NAND gates, wherein the logic circuit is enabled to generate the first and second control signals by an enable signal which is applied to each of the NAND gates.

13. The circuit of claim 8, wherein each of the first and second switches is a MOSFET transistor.

* * * * *

UNITED STATES PATENT AND TRADEMARK OFFICE
CERTIFICATE OF CORRECTION

PATENT NO. : 5,414,709
DATED : 5/9/95
INVENTOR(S) : Mel Bazes

It is certified that error appears in the above-indentified patent and that said Letters Patent is hereby corrected as shown below:

On the Title Page, Under [75] Inventor, Delete "Mel Baze"; Insert in place thereof --Mel Bazes--

Column 1, Line 24; Delete "DO"; Insert in place thereof --DC--

Column 5, Line 61; Delete " " "

Signed and Sealed this

Fourteenth Day of November, 1995

Attest:

BRUCE LEHMAN

*Attesting Officer*   *Commissioner of Patents and Trademarks*